United States Patent [19]

Bianchi et al.

[11] 4,166,248
[45] Aug. 28, 1979

[54] SAMPLE AND HOLD FREQUENCY TO VOLTAGE CONVERTER CIRCUIT

[75] Inventors: Frank J. Bianchi, Redford Township, Wayne County; Russell H. Poulson, Dearborn Heights, both of Mich.

[73] Assignee: Ford Motor Company, Dearborn, Mich.

[21] Appl. No.: 854,880

[22] Filed: Nov. 25, 1977

[51] Int. Cl.² ............................................. H03K 1/14
[52] U.S. Cl. .................................... 328/140; 328/151; 307/353; 307/264; 307/273; 307/246; 324/169
[58] Field of Search ....................... 328/140, 141, 151; 307/352, 353, 261, 264, 233 A, 233 R, 273, 246; 324/169

[56] References Cited

U.S. PATENT DOCUMENTS

| 3,333,109 | 7/1967 | Updike | 307/233 R |
|---|---|---|---|
| 3,535,658 | 10/1970 | Webb | 328/151 X |
| 3,782,784 | 1/1974 | Marouby | 328/140 |
| 3,801,918 | 4/1974 | Milne et al. | 307/233 A |
| 3,867,647 | 2/1975 | Callahan et al. | 307/233 A |
| 3,971,995 | 7/1976 | Eikelberger | 328/141 X |

*Primary Examiner*—John S. Heyman
*Attorney, Agent, or Firm*—Robert W. Brown; Clifford L. Sadler

[57] ABSTRACT

A sample and hold frequency to voltage converter circuit particularly suitable for use in automotive applications as a tachometer or other speed indicating device. The converter uses circuit means, responsive to a periodically varying input signal, to generate first and second pulse trains. The pulses in the pulse trains have a repetition frequency and duty cycle that varies as a function of the frequency of the input signal. An integrator is provided for generating a voltage proportional to the duty cycle of the second pulse train. A transmission gate is controlled by the first pulse train and couples the integrator to a capacitor. The capacitor is charged or discharged, almost instantaneously, each time the transmission gate is rendered conductive by a pulse from the first pulse train. The capacitor then develops a voltage which is proportional to the frequency of the input signal.

7 Claims, 2 Drawing Figures

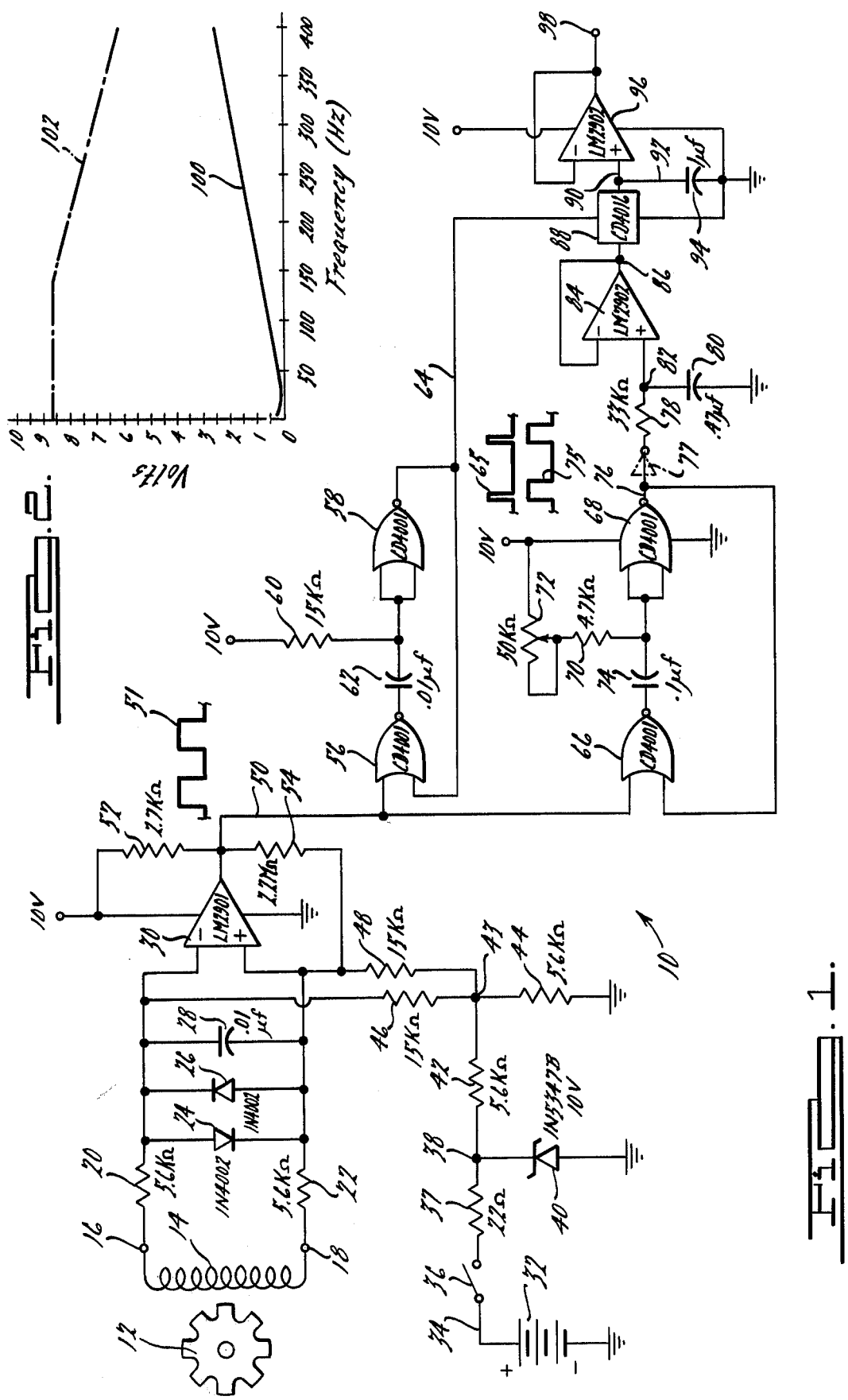

SAMPLE AND HOLD FREQUENCY TO VOLTAGE CONVERTER CIRCUIT

BACKGROUND

This invention relates to a frequency to voltage converter circuit. More particularly, the invention pertains to a sample and hold frequency to voltage converter particularly suitable for use as a tachometer (speed indicating device) in automotive applications. The converter may be utilized with an analogue or digital voltmeter to provide a display of the sensed parameters, such as engine speed, or may be used in conjunction with other circuitry, for example, in an engine speed governor application. The frquency to voltage converter also may be used in nonautomotive applications.

DESCRIPTION OF THE PRIOR ART

U.S. Pat. No. 3,798,529 to J. J. Jones described a tachometer circuit that, in its second embodiment, discloses the application of a square wave to two monostable multi-vibrators whose outputs are applied to a NOR-gate and an integrator.

U.S. Pat. No. 3,832,635 to G. R. Cass discloses an electronic speedometer that utilizes a multivibrator to produce pulses that are further processed to produce a voltage representative of wheel speed.

U.S. Pat. No. 3,867,647 to B. E. Callahan et al discloses an electronic speed measuring circuit that has an input signal conditioner, a shaper circuit and a field effect transistor switch, as does the preferred embodiment of the present invention.

SUMMARY OF THE INVENTION

The present invention provides a frequency to voltage converter circuit that has a very linear response over a wide range of input frequencies beginning at very low frequency levels. The response of the preferred circuit is linear with an input frequency above about 20 hertz, and this linearity is achieved with virtually no ripple on the output voltage waveform. The converter of the invention is particularly suitable for automotive applications as a very accurate tachometer. Very desirable features are the low ripple and linearity down to 20 hertz input frequency, which for an eight cylinder spark-ignition engine corresponds to 300 engine RPM when ignition pulses are used as the input frequency source.

The frequency to voltage converter circuit of the invention uses a sample and hold technique to achieve the outstanding linearity and low ripple at low input frequencies. The periodically varying input signal is utilized to trigger two monostable multivibrators which generate first and second pulse trains. The pulses in each of the pulse trains have a repetition frequency directly proportional to, and a duty cycle directly or inversely proportional to, the frequency of the input signal.

An integrator is provided to integrate the pulses of the second pulse train thereby to generate a voltage that varies, with high ripple content, as a function of the frequency of the input signal. A capacitor is provided and a transmission gate couples the integrator to this capacitor. The transmission gate is controlled by the first train of pulses and is switched conductive and nonconductive alternately to produce a voltage across the capacitor that varies as a function of the frequency of the input signal. This variation occurs in steps as a function of the integrator voltage at those times during which the transmission gate is conductive.

The invention may be better understood by reference to the detailed description which follows and to the drawing.

BRIEF DESCRIPTION OF THE DRAWINGS

FIG. 1 is a schematic electrical diagram of a frequency to voltage converter circuit according to the invention.

FIG. 2 is a graph of output voltage versus input frequency for the circuit of FIG. 1 and illustrates functions both directly and inversely proportional to the frequency of a periodically varying input signal.

DETAILED DESCRIPTION

With reference now to the drawing, there is shown in FIG. 1 a schematic electrical diagram of a sample and hold frequency to voltage converter circuit according to the invention. The particular circuit of FIG. 1 is intended to provide an output voltage that is proportional to the RPM of an engine of a motor vehicle. This circuit, generally designated by the numeral 10, has an output voltage that is developed from a periodically varying input electrical signal generated within the motor vehicle ignition system.

In the circuit 10, a variable reluctance pickup device includes a rotating toothed-wheel 12 positioned adjacent a pickup coil 14. The magnetic pickup 12, 14 may be located within the distributor of a motor vehicle and may be of the form illustrated in U.S. Pat. No. 3,783,314 issued Jan. 1, 1974 to Charles C. Kostan and assigned to the Ford Motor Company. With this magnetic pickup, a periodically varying input electrical signal or voltage appears across terminals 16 and 18 of the coil 14.

Terminal 16 is connected through a resistor 20 to the negative or inverting input of a comparator 30, and terminal 18 is connected through a resistor 22 to the positive or non-inverting input of the comparator. Oppositely poled diodes 24 and 26 are connected between the negative and positive inputs of the comparator 30, as is a filter capacitor 28.

A DC source of electrical energy 32, which may be a conventional 12-volt storage battery for a motor vehicle, has its negative terminal connected to ground and has its positive terminal 34 connected to one pole of an ignition switch 36 whose other pole is connected through a resistor 37 to a junction 38. The cathode of a zener diode 40 is connected to junction 38 and its anode is connected to ground thereby providing a regulated +10 volts DC at junction 38. This voltage is divided by equally valued resistors 42 and 44 to provide five volts DC at a junction 43. This DC voltage is applied through resistors 46 and 48 to the negative and positive input terminals of the comparator 30. Diodes 24 and 26 limit the negative and positive inputs of comparator 30 to ±0.6 volts above and below the DC bias potential applied to the comparator inputs.

Comparator 30, as well as several other components in the circuit 10, is supplied with the regulated 10-volt supply voltage appearing at junction 38. The output of the comparator 30 is obtained on lead 50 and has the square waveform shown at 51. Resistor 52 is a pull-up resistor and resistor 54, interconnecting the output lead 50 with the positive input lead of comparator 30, is used to provide hystersis in the switching of the comparator.

The square wave signal on lead 50 is applied to a first monostable multivibrator comprising NOR-gates 56 and 58, resistor 60 and capacitor 62. The output from the first monostable multivibrator appears on lead 64, which is connected to one input of the NOR-gate 56. Pulses appear on lead 64 as shown at 65. These pulses may have a duration of, for example, 70 microseconds. The pulse repetition frequency of the signal 65 is identical to that of the square wave 51, but each of the pulses 65 is of fixed time duration and therefore the duty cycle of the waveform on lead 64 varies with the frequency of the periodically varying input signal. The higher the engine RPM, the greater is the duty cycle of the waveform appearing on lead 64. In this connection and as used hereinafter, the term "duty cycle" refers to the fraction or percent of time of a period that a periodically varying signal is at a high voltage level.

The square wave signal 51 on lead 50 also is applied to a second monostable multivibrator including NOR-gates 66 and 68, resistors 70 and 72 and capacitor 74. Resistor 72 is variable to permit the duration of the output pulses 75 from the second monostable multivibrator, which appear on output lead 76, to be adjusted. The output pulses 75 appearing on lead 76 preferably have a duration of about 1.0 milliseconds, which is about 14 times the duration of the pulses 65. However, the pulse repetition frequency of the waveform on output lead 76 of the second monostable multivibrator is identical to that of the first monostable multivibrator. The duty cycle of the pulses 75 increases as engine speed increases. Preferably, at the highest engine speed to be measured, for example, 4500 RPM (300 Hz input frequency), the duty cycle of the pulses 75 is between 25% and 35% of the period of the periodically varying signal appearing on output lead 76. This provides very good output voltage linearity. The duration of the pulses 75 determines the scale factor or transfer function of the frequency to voltage converter 10.

The signals on lead 76 are applied to an integrator circuit comprising resistor 78 and capacitor 80 connected between ground and junction 82. Inverter 77 is optional and changes from positive to negative the slope of the circuit 10 output voltage as a function of input frequency. The output of the integrator, a voltage appearing at junction 82, is applied to the positive-input of operational amplifier 84, which is connected as a voltage follower. The output lead 86 of amplifier 84 is applied as the input to a transmission gate 88 having an output lead 90. The transmission gate is a field effect transistor device which is controlled by the pulses 65 appearing on output lead 64 of the first monostable multivibrator.

A low-leakage polycarbonate holding capacitor 94 is connected by lead 92 to the output lead 90 of the transmission gate 88 and has its other lead connected to ground. During each of the pulses 65, the transmission gate is rendered conductive to interconnect lead 86 with lead 90, thereby, to cause the holding capacitor 94, to store a charge sufficient to produce a voltage on lead 90 equal in magnitude to the voltage on lead 86 as of the time of occurrence of the pulse 65 rendering the transmission gate 88 conductive. An operational amplifier 96 connected as a voltage follower is used to buffer and isolate the signal on lead 90 from the converter output terminal 98.

The signal on lead 76 is a periodically varying waveform having pulses 75 of fixed duration but varying duty cycle and frequency due to variations in the frequency of the input signal generated by the magnetic pickup 12, 14. Each high voltage level pulse on lead 76 causes charge to accumulate in the capacitor 80. When the signal on lead 76 is at a low voltage level, the capacitor 80 discharges through the resistor 78 and the output transistor of the NOR-gate 68 or the inverter 77 if used. This is an RC charging and discharging function. The voltage at junction 82 has considerable ripple as a result of this RC charging and discharging function in the integrator 78, 80, particularly at low input frequencies. The signal at lead 86 is the same as that at lead 82 but is buffered by voltage follower 84.

The transmission gate 88 is triggered, preferably, at the same frequency that the integrating circuit 78, 80 is pulsed. Holding capacitor 94 acquires a voltage that corresponds to the voltage at junctions 82 and 86 at each time a pulse 65 occurs. Preferably, the pulses 65 and 75 have leading edges that coincide in time, but this is not essential. The important factor is that the voltage appearing across the holding capacitor 94 is the sampled voltage appearing at terminals 82 and 86 at corresponding instants or phase angles of the periodically varying signal occurring at terminals 82 and 86. For this reason, the signal on lead 90 does not have the ripple characteristics that appear in the signal at terminals 82 and 86. As was previously mentioned, this is of particular significance at low frequencies. The signal on lead 90 does not change between sample pulses 65, but instead remains constant and only changes during pulses 65 if the input frequency has changed.

The voltage at output terminal 98 of the circuit 10 is the voltage across the capacitor 94. As the frequency of the input signal changes in either increasing or decreasing direction, the voltage on output terminal 98 varies in steps that occur at a rate corresponding to the pulse repetition frequency of the sampling pulses 65 appearing on output lead 64 from the first monostable multivibrator. This is because each of the sampling pulses 65 closes the transmission gate 88 causing the holding capacitor 94 to have a voltage developed across it equal to the instantaneous value of the voltage on terminals 82 and 86. If the input frequency does not change, the voltage at terminal 98 remains constant with essentially no ripple.

FIG. 2 illustrates the transfer function for the circuit 10 for input frequencies, expressed in hertz, from 0 to about 400 Hz. For the circuit depicted in FIG. 10 and in the absence of inverter 77, the straight line or very linear function 100 is obtained at terminal 98. The frequency is related to engine RPM, in the illustrated and described tachometer engine application, by a factor of 15, which means that at 100 Hz, the corresponding engine RPM for an eight cylinder engine is 1500, and 300 Hz corresponds to an engine RPM of 4500. It should be noted that when the engine RPM is below the 20 Hz (300 RPM) level, the output voltage versus input frequency function for the circuit 10 becomes nonlinear. However, the very linear performance down to this very low frequency level is without ripple and of greatly improved character as compared to prior art frequency to voltage converter circuits. The data used to plot the transfer function 100 was obtained using a pulse width of 70 microseconds for the sampling pulses 65 and a pulse width of 1.0 milliseconds for the pulses 75 at the output lead 76 of the second monostable multivibrator.

The transfer function 100 is directly proportional to the input frequency. Curve 102 in FIG. 2 illustrates a transfer function which is inversely proportional to the input frequency. This is obtained by the insertion, just before the resistor 78 in the integrator, of the inverter 77. The inverter causes the pulses that are applied to the integrator 78, 80 to have a duty cycle which decreases as the input frequency to the circuit 10 increases.

It should be noted that the integrating circuit includes the integrator capacitor 80 which is charged through resistor 78 whenever the voltage on lead 76 is at a level above ground potential, that is, during the high voltage level of the pulsating signal on lead 76. During the low level of the signal on lead 76, the integrator capacitor 80 discharges through an output transistor in the NOR-gate 68 or in the inverter 77, which transistor when saturated is coupled to ground. Due to the periodic variation of the signal on lead 76, capacitor 80 is repeatedly being charged and discharged at the pulse repetition frequency of the pulse train produced on lead 76 and the integrator capacitor has a voltage across it which varies periodically as a result of this repetitive charging and discharging. When the transmission gate 88 is rendered conductive by and during each of the pulses 65 produced on lead 64 by the first monostable multivibrator, a voltage is acquired across the holding capacitor 94. The voltage acquired across this capacitor is the same as the voltage on terminals 82 and 86 as of the instant in time that the transmission gate is rendered conductive. Since the transmission gate is rendered conductive at times that correspond to equal phase angles of the periodically varying voltage across integrator capacitor 80, the voltage acquired across the holding capacitor 94 is the integrator capacitor voltage as of such times corresponding to equal phase angles.

In view of the above discussion, it is apparent that the ripple produced in the voltage at terminal 82 of capacitor 80 due to the charging and discharging of this capacitor does not appear at the output terminal 98 of the voltage to frequency converter circuit because the voltage on the integrator capacitor 80 is sampled and held within the capacitor 94 at corresponding times or phase angles in the periodically varying voltage at terminal 82.

If the leading edge of the sampling pulse 65 corresponds to the leading edge of the pulse 75 used to charge the capacitor 80, the voltage on capacitor 80 is sampled by the transmission gate 88 and holding capacitor 94 at those times during which the voltage across capacitor 80 is at the minimum value for its current cycle.

Based upon the foregoing description of the invention, what is claimed is:

1. An improved tachometer of the type including means for generating a periodically varying electrical input signal having a frequency proportional to the speed of rotation of a rotating member and a frequency to voltage converter circuit for converting the frequency of the periodically varying input signal to a voltage having a magnitude proportional to such frequency, wherein the tachometer has an improved frequency to voltage converter circuit comprising:

circuit means, supplied with said input signal, for generating first and second pulse trains, said first pulse train comprising a pulsating signal having a repetition frequency proportional to the frequency of said input signal, said second pulse train comprising a pulsating signal having a repetition frequency and duty cycle proportional to the frequency of said input signal;

integrator circuit means, supplied with said second pulse train, for generating an integrator voltage proportional to the duty cycle of said second pulse train;

a transmission gate coupled to said circuit means for generating said first and second pulse trains; and a holding capacitor, said transmission gate when conductive coupling said integrator circuit means to said holding capacitor, said transmission gate being rendered alternately conductive and nonconductive by the pulsating signal of said first pulse train, said holding capacitor acquiring a voltage across it which varies as a function of said integrator voltage at those times in which said transmission gate is conductive.

2. A frequency to voltage converter circuit in accordance with claim 1 wherein said integrator circuit means includes an integrator capacitor charged and discharged at the pulse repetition frequency of said second pulse train, said integrator capacitor having a voltage across it which varies periodically as a result of said charging and discharging.

3. A frequency to voltage converter according to claim 2 wherein said transmission gate is rendered conductive by pulses of said first pulse train, said pulses occurring at times corresponding to equal phase angles of said periodically varying integrator capacitor voltage, said voltage acquired across said holding capacitor being said integrator capacitor voltage as of said times corresponding to equal phase angles.

4. A frequency to voltage converter circuit according to claim 1 including inverter means for causing said voltage proportional to the frequency of said input signal to be inversely proportional to the frequency of said input signal.

5. A frequency to voltage converter circuit according to claim 3 which includes means for causing said voltage acquired across said holding capacitor to vary inversely with the frequency of said input signal.

6. A frequency to voltage converter circuit according to claim 5 which includes a voltage follower coupling said integrator circuit means to said transmission gate.

7. A frequency to voltage converter circuit according to claim 6 which includes a voltage follower having an input coupled to one terminal of said holding capacitor and having an output terminal for making available said voltage proportional to the frequency of said input signal.

* * * * *